(12) United States Patent  (10) Patent No.: US 9,088,020 B1
Zehavi et al.  (45) Date of Patent: Jul. 21, 2015

(54) STRUCTURES WITH SACRIFICIAL TEMPLATE

(71) Applicant: Integrated Photovoltaics, Inc., San Jose, CA (US)

(72) Inventors: Sharone Zehavi, San Jose, CA (US); Willibrordus Gerardus Maria van den Hoek, San Jose, CA (US)

(73) Assignee: Integrated Photovoltaics, Inc., San Jose, CA (US)

( * ) Notice: Subject to any disclaimer, the term of this patent is extended or adjusted under 35 U.S.C. 154(b) by 0 days.

(21) Appl. No.: 13/708,454

(22) Filed: Dec. 7, 2012

(51) Int. Cl.
 *B44C 1/22* (2006.01)
 *H01M 4/04* (2006.01)
 *H01L 31/18* (2006.01)
 *H01M 4/38* (2006.01)

(52) U.S. Cl.
 CPC ......... *H01M 4/0433* (2013.01); *H01L 31/1892* (2013.01); *H01M 4/0402* (2013.01); *H01M 4/386* (2013.01)

(58) Field of Classification Search
 USPC .......................................... 216/41, 24, 58, 83
 See application file for complete search history.

(56) References Cited

U.S. PATENT DOCUMENTS

| 7,789,331 | B2 | 9/2010 | Zehavi |
|---|---|---|---|
| 8,107,270 | B2 | 1/2012 | Scheuerlein |
| 8,110,419 | B2 | 2/2012 | Zehavi |
| 8,153,528 | B1 | 4/2012 | Hendler |
| 8,168,284 | B2 | 5/2012 | Nealey |
| 8,178,165 | B2 | 5/2012 | Jin |
| 8,207,013 | B2 | 6/2012 | Yang |
| 8,226,838 | B2 | 7/2012 | Cheng |
| 2007/0047056 | A1 | 3/2007 | Kempa |
| 2007/0137697 | A1 | 6/2007 | Kempa |
| 2008/0220558 | A1 | 9/2008 | Zehavi |
| 2009/0001936 | A1 | 1/2009 | Green |
| 2010/0237050 | A1 | 9/2010 | Zehavi |
| 2010/0243963 | A1 | 9/2010 | Zehavi |
| 2010/0304035 | A1 | 12/2010 | Zehavi |
| 2010/0319759 | A1* | 12/2010 | Fisher et al. ................. 136/252 |
| 2011/0041903 | A1 | 2/2011 | Zehavi |
| 2011/0045630 | A1 | 2/2011 | Zehavi |
| 2011/0189405 | A1 | 8/2011 | Zehavi |
| 2011/0192461 | A1 | 8/2011 | Hendler |
| 2011/0269264 | A1 | 11/2011 | Korevaar |
| 2011/0277827 | A1 | 11/2011 | Yang |
| 2012/0031454 | A1 | 2/2012 | Fogel |
| 2012/0097232 | A1 | 4/2012 | Kim |
| 2012/0125071 | A1 | 5/2012 | Schroers |
| 2012/0135159 | A1 | 5/2012 | Xiao |
| 2012/0164781 | A1 | 6/2012 | Street |
| 2012/0177841 | A1 | 7/2012 | Thompson |
| 2012/0189824 | A1 | 7/2012 | Nealey |
| 2012/0202017 | A1 | 8/2012 | Nealey |
| 2012/0237733 | A1 | 9/2012 | Bosworth |
| 2012/0244391 | A1 | 9/2012 | Yushin |

(Continued)

OTHER PUBLICATIONS

Weiss, Dirk; "Nanoimprinting for diffravtive light trapping in solar cells"; J.Vac.Sci. Technol.B28(6), Nov./Dec. 2010.

(Continued)

*Primary Examiner* — Shamim Ahmed
(74) *Attorney, Agent, or Firm* — Fernandez & Associates, LLP

(57) ABSTRACT

A removable, or reusable, template suitable for forming three dimensional structures of various devices ranging from photovoltaics to electrodes for electrochemical cells is disclosed.

11 Claims, 7 Drawing Sheets

(56) References Cited

U.S. PATENT DOCUMENTS

| | | |
|---|---|---|
| 2012/0248414 A1 | 10/2012 | Kim |
| 2012/0272490 A1* | 11/2012 | Moslehi et al. ............... 29/239 |
| 2012/0305063 A1* | 12/2012 | Moslehi et al. ............. 136/256 |

OTHER PUBLICATIONS

Weiss, Dirk; "All-inorganic thermal nanoimprint process"; J.Vac.Sci. Technol.B28(4), Jul./Aug. 2010.

Richmond, Dustin, et al; "Pressureless nanoimprinting of anatase TiO2 precursor films"; J.Vac.Sci. Technol.B29 (2), Mar./Apr. 2011.

Garnett, Erik, et al.; "Silicon Nanowire Radial p-n Junction Solar Cells"; J.Am.Chem.Soc. 2008, 130, 9224.

Garnett, Erik, et al.; "Silicon Nanowire Hybrid Photovoltaics"; 978-1-4244-5892-9/10; 2010 IEEE.

Garnett, Erik, et al.; "Nanowire Solar Cells"; Annu.Rev.Mater.Res. 2011, 41; 269.

Kim, Philseok, et al.; "Structural Transformation by Electrodeposition . . . ";ACS Publications, Nano Lett; Mar. 31, 2011.

Jeong, Sangmoo, et al.; "Hybrid Silicon Nanocone-Polymer Solar Cells"; ACS Publications, Nano Lett; 2012, 12, 2971.

Hsu, Ching-Mei, et al.; "High Efficiency Amorphous Silicon Solar Cell . . . "; Adv.Energy Mater. 2012, 2, 628.

Kim, Jeehwan, et al.; "Three-dimensional a-Si:H Solar Cells on Glass Nanocone Arrays . . . "; ACSNano, 6,1,265,2012.

Becker, C., et al.; "Large-area 2D periodic crystalline silicon nanodome arrays . . . "; Nanotechnology 23, 2012, 135302.

Jeong Jae Won, et al.; "Nanotransfer printing with sub-10nm resolution using directed self-assembly"; Adv.Mater. 2012; wileyonline.com.

Tavakkoli, K.G.; et al.; Templating three dimensional Self-assembled structures in bilayer block copolymer films; Science, 336, 6086, 1294 (2012).

Liu, Xiao Hua, et al.; "Insitu atomic-scale imaging of electrochemical lithiation in silicon"; nature nanotechnology, Oct. 7, 2012.

Wu, Hui, et al.; "Six thousand electrochemical cycles of double-walled silicon nanotube anodes for lithium ion batteries"; SLAC-PUB-14379, 2011.

Liu, Nian, et al.; "A yolk design for stabilized and scalable Li-ion battery alloy anodes"; ACS Nano Lett Apr. 2012.

Cushen, J., et al.; "Oligosaccharide/Silicon-Containing Block Coplolymers with 5 nm Features for Lithographic Applications"; ACS Nano, 6(4), 2012 , 3424.

* cited by examiner

Figure 2A

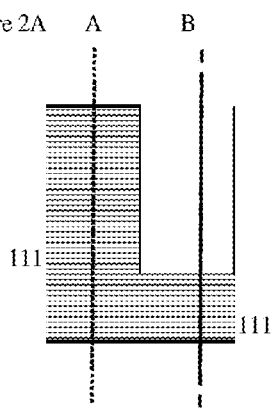

Figure 2B  200

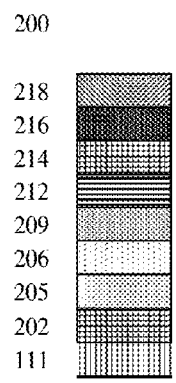

Exemplary Layers

| # | Layer |
|---|---|
| 218 | flexible support layer, optionally reflective |
| 216 | barrier layer |
| 214 | passivation layer |
| 212 | TCO/ARC |
| 209 | p+ |
| 206 | i |
| 205 | n |
| 202 | conductive, barrier layer |
| 111 | patterned sacrificial template |

Radiation 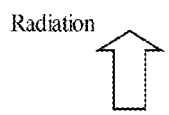

Figure 2C  201  Exemplary Layers

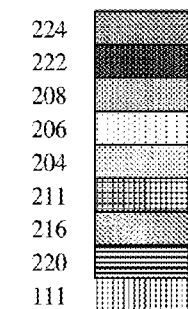

| # | Layer |
|---|---|
| 224 | flexible, conductive support layer |
| 222 | Conductive "matching" layer |
| 208 | p+ |
| 206 | i |
| 204 | n-    resistivity 0.1 to 15 ohm cm |
| 211 | ARC / TCO layer |
| 216 | Barrier layer |
| 220 | "Front" Metal |
| 111 | patterned sacrificial template |

Radiation 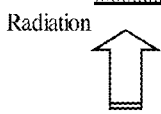

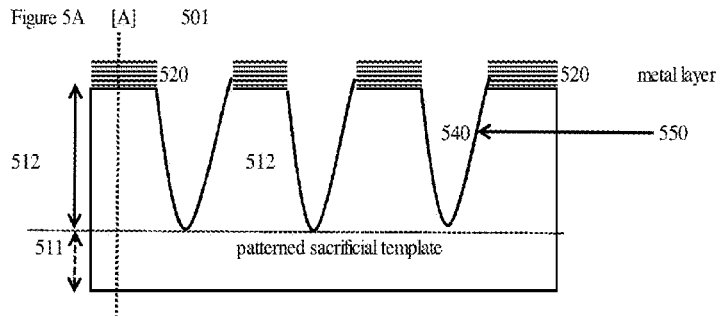

Figure 5A [A] 501

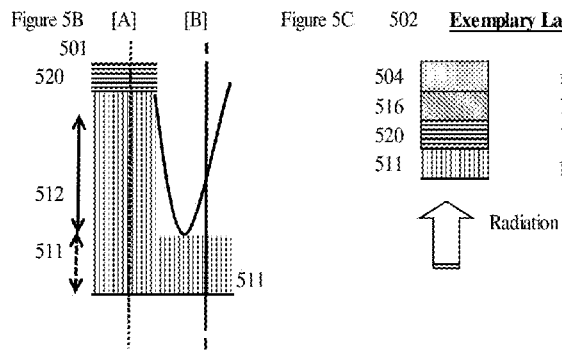

Figure 5B [A] [B]

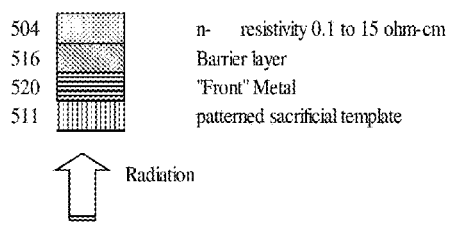

Figure 5C  502  Exemplary Layers  [A]

| | | |
|---|---|---|
| 504 | | n-  resistivity 0.1 to 15 ohm-cm |
| 516 | | Barrier layer |
| 520 | | "Front" Metal |
| 511 | | patterned sacrificial template |

⬆ Radiation

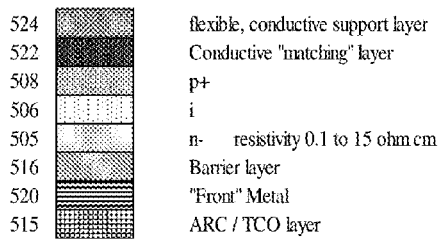

Figure 5D  503  Exemplary Layers  [A]

| | | |
|---|---|---|
| 524 | | flexible, conductive support layer |
| 522 | | Conductive "matching" layer |
| 508 | | p+ |
| 506 | | i |
| 505 | | n-  resistivity 0.1 to 15 ohm cm |
| 516 | | Barrier layer |
| 520 | | "Front" Metal |
| 515 | | ARC / TCO layer |

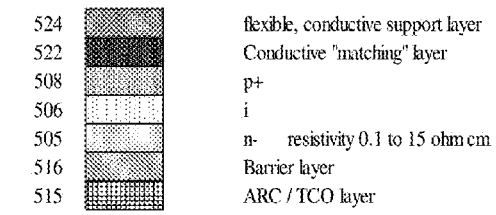

Figure 5E  503  Exemplary Layers  [B]

| | | |
|---|---|---|
| 524 | | flexible, conductive support layer |
| 522 | | Conductive "matching" layer |
| 508 | | p+ |
| 506 | | i |
| 505 | | n-  resistivity 0.1 to 15 ohm cm |
| 516 | | Barrier layer |
| 515 | | ARC / TCO layer |

Radiation ⬆

A template comprising an array of cylinders on a substrate.

Roll Compaction: a variety of shapes and sizes are easily achievable in the green stage

STRUCTURES WITH SACRIFICIAL TEMPLATE

CROSS-REFERENCE TO RELATED APPLICATIONS

This application is related in part to U.S. application Ser. Nos. 12/720,153, 12/749,160, 12/789,357, 12/860,048, 13/010,700, 13/019,965, 13/073,884, 13/077,870, 13/104,881, 13/214,158, 13/234,316, 13/268,041, 13/272,073, 13/273,175, 13/300,046 and U.S.2008/0220558, U.S. Pat. No. 7,789,331, U.S. Pat. No. 8,110,419, U.S. Pat. No. 8,153,528 all owned by the same assignee and all incorporated by reference in their entirety herein. Additional technical explanation and background is cited in the referenced material.

BACKGROUND OF THE INVENTION

1. Field of the Invention

The invention discloses methods and building blocks comprising structures deposited on to a removable template comprising a layer of a semiconductor wherein the template is removed before device operation. Optionally a structure may have varied utility such as a photovoltaic device or a component in a battery.

2. Description of Related Art

Related art is found in U.S. Pat. No. 7,789,331; U.S. Pat. No. 8,110,419; U.S. Pat. No. 8,153,528; U.S. Pat. No. 8,207,013; U.S. Pat. No. 8,226,838; U.S.2008/0220558; U.S.2011/0045630; U.S.2010/0243963; U.S.2010/0304035; U.S.2010/0237050; U.S.2011/0192461; U.S.2011/0189405; U.S.2011/0041903; U.S.2012/0031454; U.S.2010/0319759; U.S.2012/0125071; U.S.2012/0164781; U.S.2012/0177841; U.S.2012/0097232; U.S.2011/0277827; U.S.2011/0269264; U.S.202007/0137697; U.S.2007/0047056; U.S.2012/0135159; U.S.2012/0202017; U.S.2009/0001936; U.S.2012/0244391; U.S. Pat. No. 8,178,165; U.S. Pat. No. 8,107,270; U.S. Pat. No. 8,168,284; U.S.2012/0189824; U.S.2012/0237733; U.S.2012/0248414 and publications, WEISS, DIRK; "All-inorganic thermal nanoimprint process"; J. Vac. Sci. Technol. B28(4), July/August 2010; WEISS, DIRK; "All-inorganic thermal nanoimprint process"; J. Vac. Sci. Technol. B28(4), July/August 2010; RICHMOND, DUSTIN, et al; "Pressureless nanoimprinting of anatase TiO2 precursor films"; J. Vac. Sci. Technol. B29(2), March/April 2011; GARNETT, ERIK, et al.; "Silicon Nanowire Radial p-n Junction Solar Cells"; J. AM. Chem. Soc. 2008, 130, 9224; GARNETT, ERIK, et al.; "Silicon Nanowire Hybrid Photovoltaics"; 978-1-4244-5892-9/10; 2010 IEEE; GARNETT, ERIK, et al.; "Nanowire Solar Cells"; Annu. Rev. Mater. Res. 2011, 41; 269; KIM, PHILSEOK, et al.; "Structural Transformation by Electrodeposition."; ACS Publications, Nano Lett; Mar. 31, 2011; JEONG, SANGMOO, et al.; "Hybrid Silicon Nanocone-Polymer Solar Cells"; ACS Publications, Nano Lett; 2012, 12, 2971; HSU, CHING-MEI, et al.; "High Efficiency Amorphous Silicon Solar Cell . . . "; Adv. Energy Mater. 2012, 2, 628; KIM, JEEHWAN, et al.; "Three-dimensional a-Si:H Solar Cells on Glass Nanocone Arrays . . . "; ACSNano, 6, 1, 265, 2012; BECKER, C., et al.; "Large-area 2D periodic crystalline silicon nanodome arrays . . . "; Nanotechnology 23, 2012, 135302; JEONG JAE WON, et al.; "Nanotransfer printing with sub-10 nm resolution using directed self-assembly"; Adv. Mater. 2012; wileyonline.com; TAVAKKOLI, K. G.; et al.; "Templating three dimensional self-assembled structures in bilayer block copolymer films"; Science, 336, 6086, 1294 (2012); LIU, XIAO HUA, et al.; "Insitu atomic-scale imaging of electrochemical lithiation in silicon"; nature nanotechnology, 7 Oct., 2012; WU, HUI, et al.; "Six thousand electrochemical cycles of double-walled silicon nanotube anodes for lithium ion batteries"; SLAC-PUB-14379, 2011; LIU, NIAN, et al.; "A yolk design for stabilized and scalable Li-ion battery alloy anodes"; ACS Nano Lett April, 2012; CUSHEN, J., et al.; "Oligosaccharide/Silicon-Containing Block Copolymers with 5 nm Features for Lithographic Applications"; ACS Nano, 6(4), 2012, 3424. Related art cited are incorporated in their entirety herein by reference.

In 2006 Kempa filed on a radial nano-coax structure for a solar cell. Over time this structure has evolved into a radial p-n junction and recently into a plurality of structures including peaks and troughs from IBM. All suffer from being too costly for wide spread implementation as solar cells.

SUMMARY OF THE INVENTION

A removable, or reusable, template suitable for forming three dimensional structures of various devices ranging from photovoltaics to electrodes for electrochemical cells is disclosed. Many ideas are available for producing devices; only those with the lowest cost structure survive; solar cells and batteries are key examples of the endless pursuit of minimizing manufacturing cost. The instant invention discloses a technique employing a sacrificial or removable template for eliminating several conventional manufacturing steps. The method is applicable to a broad range of devices employing semiconductor materials or techniques.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 2A is a schematic view of cross sections through a template before removal of the template for some embodiments; FIG. 2B is a schematic view of exemplary layers for a device constructed upon a sacrificial template; FIG. 2C is a schematic view of exemplary layers for a different exemplary device constructed upon a sacrificial template.

FIG. 5A is a schematic view of an exemplary template after 3D pattern formation; FIG. 5B is a schematic view of an exemplary template after 3D pattern formation showing cross sections [A], [B] and [C]; FIG. 5C is a schematic view of an exemplary template plus deposited layers prior to template removal; FIG. 5D is a schematic view of an exemplary device structure through cross section [A] after template removal; FIG. 5E is a schematic view of an exemplary device structure through cross sections [B] and [C] after template removal.

DETAILED DESCRIPTION OF THE PREFERRED EMBODIMENTS

The subject matter of the various embodiments is described with specificity to meet statutory requirements. However, the description itself is not intended to limit the scope of this patent. Rather, the inventor has contemplated that the claimed subject matter might also be embodied in other ways, to include different steps or elements similar to the ones described in this document, in conjunction with other present or future technologies. Moreover, although the term "step" may be used herein to connote different aspects of methods employed, the term should not be interpreted as implying any particular order among or between various steps herein disclosed unless and except when the order of individual steps is explicitly required. It should be understood that the explanations illustrating data or process flows are only exemplary. The following description is illustrative and non-limiting to any one aspect.

In some embodiments a "removable template" is a carbon based material as disclosed in U.S. Pat. No. 8,153,528. Exemplary templates are carbon, and carbon based materials such as carbon tissue or carbon paper, graphite, graphite foils and including inorganic particles; optionally, a template may be a patternable, organic film that is pyrolyzed after patterning such that a three dimensional carbon structure is achieved. All templates share a common characteristic; the template material is removable by a means not injurious to the structure formed or deposited upon the template; in some cases the template is removed destructively; in some cases non-destructively. In the case of carbon based materials one exemplary method of removal is to oxidize the carbon at some temperature below a critical temperature; in general this is typically less than 1200° C.; when an oxygen plasma is used, the temperature may be as low as 300-500° C. In some embodiments a filling material may be used to create a smooth working surface on the substrate for subsequent layers. Exemplary filling materials comprise organic polymers, including, polyimides, epoxies, resins, and spin-on-glasses; in some embodiments exemplary filling materials are molten silicon, or silicon powder that is subsequently melted; low-temperature glasses and low temperature melting metals may also be used when selective etching, wet or dry, is available for their removal.

Figure 1A:
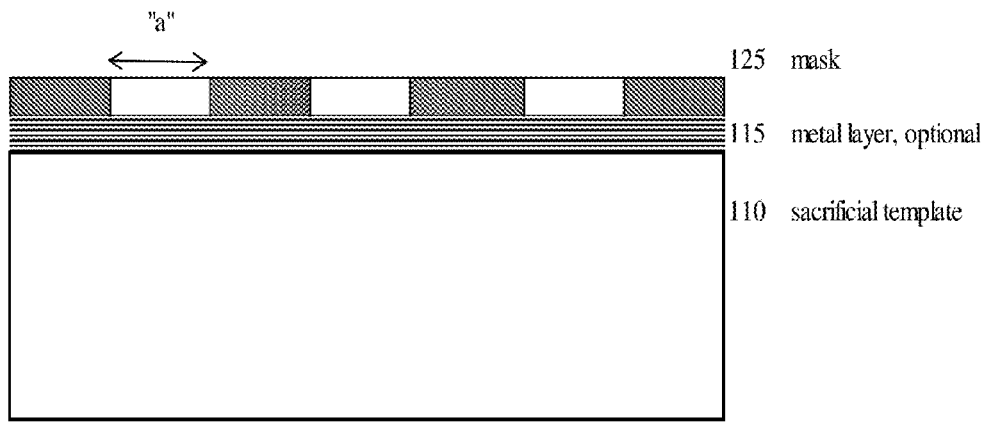
FIG. 1A is a schematic view of an exemplary template before patterning with optional barrier layer and mask layer.
Figure 1B:
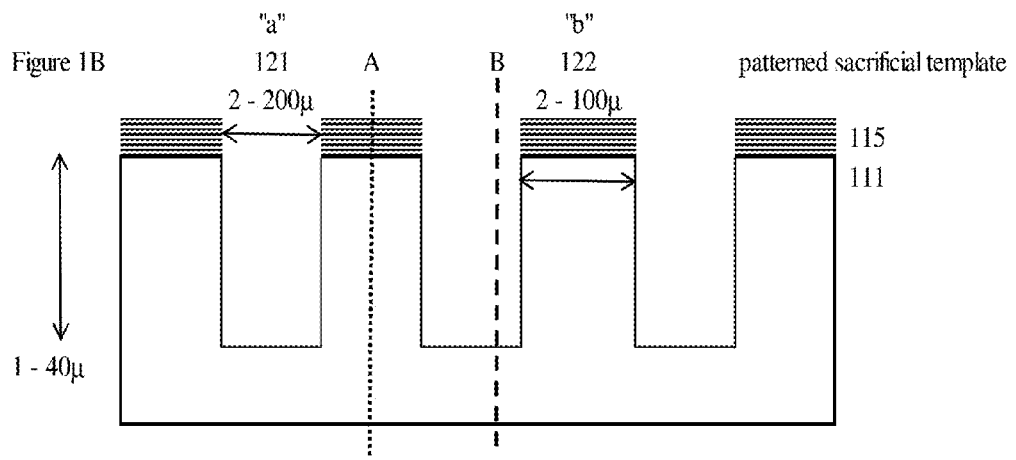
FIG. 1B is a schematic view of exemplary dimensions of a patterned sacrificial template.

A template material is able to be patterned such that a desired structure can be formed or deposited upon a patterned template. FIGS. 1-3 show exemplary structures suitable for a photovoltaic device. FIG. 1A shows schematically "sacrificial template" 110 prior to patterning with optional metal or protective layer 115 and patterned mask material 125 on layer 115. FIG. 1B shows patterned, sacrificial template 111; exemplary trench, or feature, 121 may have width, [a], from about 2 microns to 200 microns; exemplary column 122 may have width, [b], from about 2 microns to 200 microns; depth of trench 121 ranges from about 1 micron to about 40 microns. FIG. 1B shows vertical sidewalls; optionally, side walls may be sloped between 90 degrees, vertical, and 45 degrees. The slope is the result of a lateral etch component, to cause the material to be undercut underneath the mask; optionally, metal masking layer 115 may be left in place before coating the structure with Si or another PV material. Lines A and B refer to cross sections through template 111 after deposition and after template removal as shown in FIGS. 2 and 3.

FIG. 2A shows template 111 prior to deposition; FIGS. 2B and 2C show exemplary photovoltaic devices 200 and 201 after deposition on template 111 as in cross section based upon the order of deposition. Device 200 begins with conductive, barrier layer 202; followed by an n type semiconductor 205; an intrinsic type semiconductor 206; a p+ semiconductor 209; next is a transparent, conductive oxide 212, optionally, an anti-reflective coating also; optional passivation layer 214, optional barrier layer 216 and finally flexible support layer 218; flexible support layer may be reflective as well. Device structure 201 is shown in FIG. 2C; front metal 220 is used as a mask; optionally, barrier layer 216; optionally, ARC and/or TCO layer(s); active layers; optional, conductive matching layer 222; flexible support layer 224. Alternative structures known to one knowledgeable in the art are within the scope of the disclosed invention.

Figure 3A:
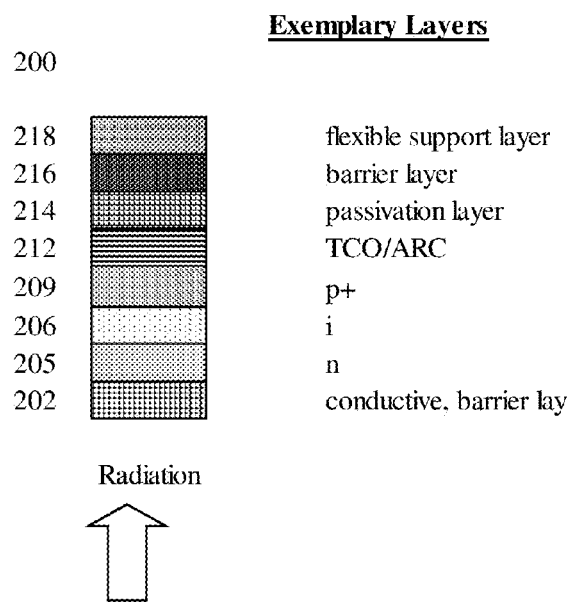
FIG. 3A is a schematic view of an exemplary layer structure.
Figure 3B:
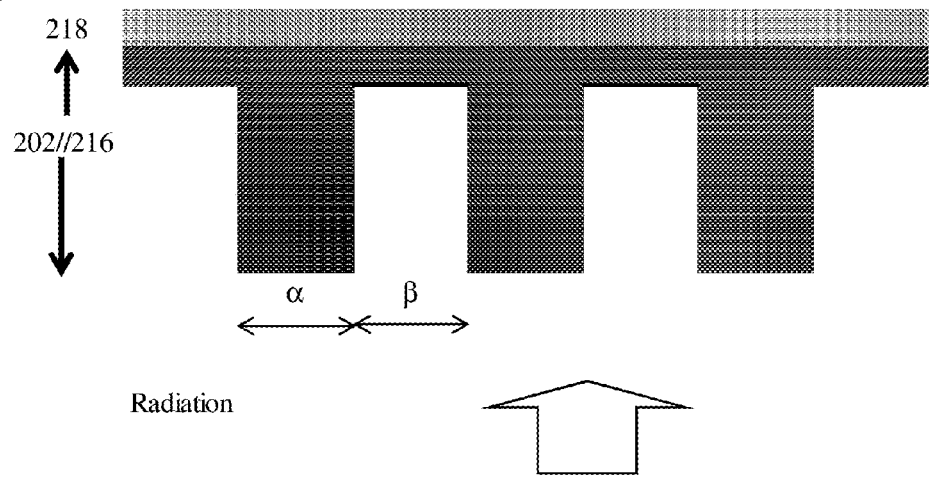
FIG. 3B is a schematic view of an exemplary device after template removal.
Figure 4:
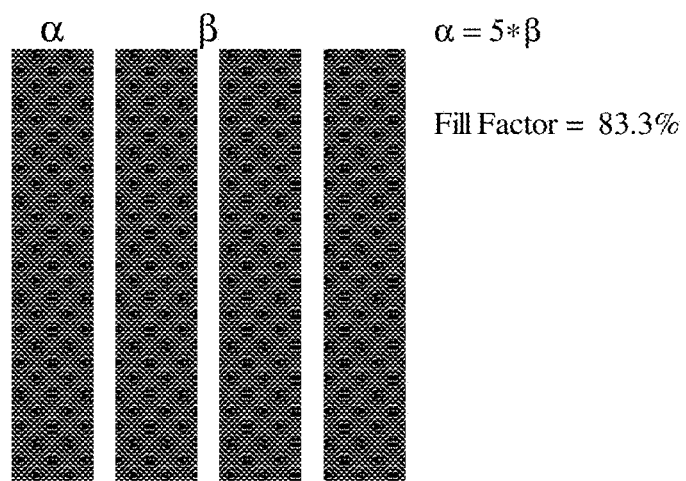
FIG. 4 is a schematic top view of an exemplary device showing percent of Fill for active regions.

FIGS. 3A and 3B show exemplary structure 200 after removal of template 111. FIG. 3A shows one embodiment of layer deposition. FIG. 3B shows a structure after removal of its template. Deposited material, of width α, comprises layers 202 through 218; template material is removed up to width β. FIG. 4 shows schematically a fill factor calculation giving a ratio of deposited material, α, to open space, β, for a case where α=5*β.

In some embodiments a device constructed on a sacrificial template comprises an active layer wherein a first portion of the active layer has been recrystallized as a step in the device fabrication. FIG. 5A is a schematic view of an exemplary template after 3D pattern formation wherein a metal layer 520 forms a mask for the definition of feature 540, defined by wall 550. Exemplary structure 501 comprises template 511, similar to sacrificial template 110 or 111 of FIGS. 1A and 1B; however in some embodiments template 511 has an upper portion, 512, that is the sacrificial part; portion 511 is removable from portion 512 and reusable. Composition of template portions 511 and 512 are chosen from a group comprising graphite, graphite foil, carbon, pyrolitic carbon, carbon foil, carbon tissue, ceramic, boehmite, $Al_2O_3$, carbides, nitrides, silicides, zirconia, tungsten, silicon alumina, flexible organic sheet, polyimide, conductive powder, spin-on-glass, quartz, polymeric organic, resin, epoxy, inorganic polymer, silicon, silicon from a plasma spray or molten silicon from a liquid source, SiC, TiC, TiN, BN, and W. Feature 540 may be a cylinder, channel, ellipsoid or other shape operable as a photovoltaic device in finished form. In some embodiments portion 511 is flexible.

FIG. 5B is a schematic view of an exemplary template structure 501 after 3D pattern formation showing cross sections [A] and [B]; FIG. 5C is a schematic view of an exemplary template structure 502 plus deposited layers prior to template removal. In FIG. 5C the layers deposited on a template are shown in the order of deposition through cross section [A]; optional barrier layer 516 is included as well as first portion of active layer 504, n type semiconductor. At this point recrystallization of layer 504 can take place, transforming to layer 505, before additional layers are deposited. Subsequent layers deposited are shown in FIG. 5D, through [A] and FIG. 5E through [B]. In FIG. 5E front metal 520 is not present in the feature as 520 is used as a mask to form the feature. Barrier layer 516 is optional depending upon the material selection for the front metal and device characteristics. Layer 504 is, optionally, n or p type silicon; optionally a Group IV, III-V, or II-VI semiconductor; optionally, layer 504 is deposited by a conventional deposition process, including plasma spray as described in the related art material. In some embodiments layer 504 is recrystallized after deposition to layer 505. Optionally, after recrystallization and one or more depositions, template portion 511 is removed; in some embodiments when portion 512 is present it may or may not be removed at this point.

FIG. 5D is a schematic view of an exemplary device structure through cross section [A] after template removal; layer 515, an anti-reflection coating and/or a transparent conductive oxide, has been added to the "front" surface. FIG. 5E is a schematic view of an exemplary device structure through cross sections [B] after template removal. Additional layers 506, intrinsic or "not-intentionally-doped" layer and a p, or n, type layer, 508, added to complete an active layer; note layer 506 is optional. Exemplary layers 522, a transition layer, optionally conductive and layer 524, a support layer, optionally flexible or not and optionally conductive. In the disclosed fashion a device structure is constructed upon a template, at least a portion of which is removed.

In some embodiments a removable template is a carbonaceous material; optionally, flexible; optionally suitable for reel-to-reel processing. In some embodiments the surface of a carbonaceous removable template is prepared by planarizing a deposited layer or coating; optionally, lapping or chemical-mechanical polishing, CMP, process may also be used. A deposited layer may be formed by conventional means such as chemical vapor deposition, CVD, including hot wire CVD, physical vapor deposition, PVD, and variants such as LPCVD, ALD, PECVD, also included are plasma spray and molten liquid deposition. A coated layer may be an organic or polymer, including polyimides, epoxies, spin-on-glasses, SOG, and others known to one knowledgeable in the art.

In some embodiments a sacrificial template is patterned by various methods as disclosed in U.S. Ser. No. 13/300,046, U.S. Pat. No. 8,226,838, U.S.2012/0135159, U.S.2012/0202017; the cited literature and variations and combinations as disclosed herein. In some embodiments a template for imprinting a pattern is employed to contact print a linear pattern for achieving a groove pattern as shown in FIG. 1B. Next a block co-polymer is applied such that direct self-assembly of a portion of the co-polymer is initiated based upon the imprinted material. In this way a conventional lithographic process with photoresist is unnecessary. Optionally, a self assembly technique is employed to achieve a pattern of linear and/or circular and/or other predetermined shapes or features of interest for a sacrificial template by techniques described in references cited, such as U.S. Pat. No. 8,178,165; U.S. Pat. No. 8,107,270; U.S. Pat. No. 8,168,284; U.S.2012/0189824; U.S.2012/0237733; U.S.2012/0248414; and CUSHEN, J., et al.; "Oligosaccharide/Silicon-Containing Block Copolymers with 5 nm Features for Lithographic Applications".

In some embodiments a sacrificial template is removable and subsequently reused without being sacrificed in the removing process. The removing steps may comprise one or more of the following processing steps, a destructive process step consuming a sacrificial template such as a chemical reaction, optionally oxidation, sputter etching, and/or thermal ablation; alternatively a non-destructive process step may be used to remove a sacrificial template, such as etching a release layer and/or flexing a mechanical release layer; in this way a sacrificial template may be reused.

Some embodiments of the present invention include an article having a photovoltaically active region and a photovoltaically inactive region. A photovoltaically active region, as that term is used herein, means a region of the article that includes a material that exhibits the well-known photovoltaic effect, that is, the creation of a voltage, "photovoltage", and/or a corresponding electric current, "photocurrent", when exposed to electromagnetic radiation, typically radiation in the visible and near visible wavelengths. A photovoltaically inactive region, as that term is used herein, means a region of the article that lacks such a material, or is situated such that the region lacks access to incident light, and therefore is not directly used to any practical extent for generation of electrical current. A photovoltaically active region may comprise a p-n junction, a p-i-n structure, a region comprising quantum dots or a region comprising combinations of different types of active regions.

Roll compaction is a method of fabricating continuous thin sheets of materials, optionally ceramic, by compacting flowable powders in a rolling mill. This fabrication technology allows parts to be manufactured to precise dimensional specifications, yields two identical working surfaces and tight thickness control. Roll compaction substrate technology typically incorporates three basic steps: spray dried powder preparation, tape fabrication by roll compaction and sintering.

Initially, starting materials, typically comprising high purity, ceramic or refractory powders, are ball-milled with dispersants, organic binders and/or plasticizers to achieve acceptable particle size distribution and slurry rheology. The slurry is then spray dried to form a flowable powder that can be fabricated into a tape or continuous sheet when roll compacted.

Roll compaction processes are related to dry or hot pressing in that spray dried powders are used as feedstock. However, the process differs in the type and amount of binders and plasticizers used in order to fabricate a flexible, continuous sheet, typically, a "tape".

Figure 7:
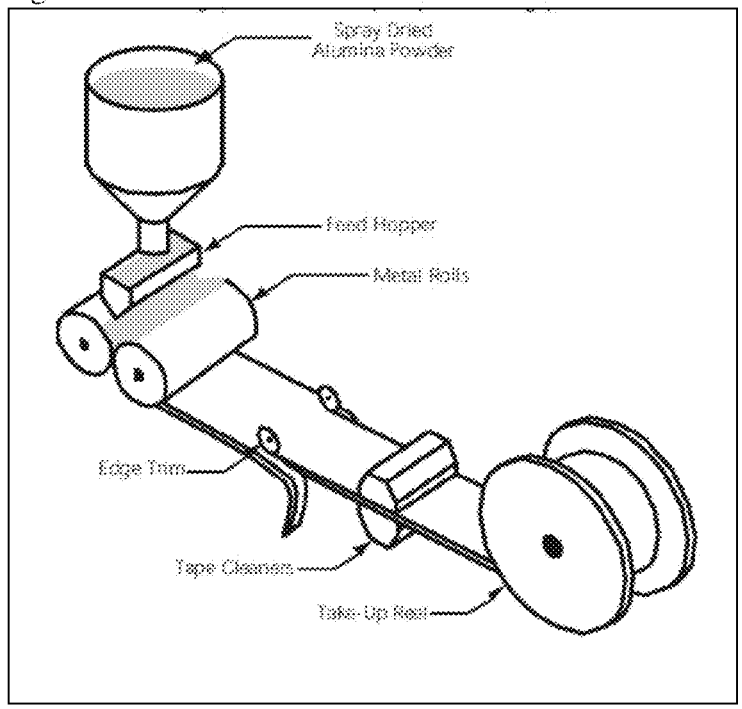
FIG. 7 is a schematic view of an exemplary roll compaction process.

One embodiment of a roll compaction process comprises a powder-feed system, continuously replenishing a reservoir above metal rollers. Powder is controllably presented to the rollers where it is subsequently compacted to form a continuous sheet. The sheet is then edge trimmed, cleaned and collected on a take-up reel. FIG. 7 illustrates an exemplary roll compaction process.

In one embodiment, tungsten carbide tooling is used to mechanically punch green tape, producing parts of a desired size and shape. Following tape punching, green parts are sintered by passing them through a high-temperature step, typically a tunnel kiln. The sintering process brings about several significant changes in a ceramic part: total surface area is reduced, bulk volume is reduced and strength is increased. An exemplary process produces polycrystalline, homogeneous parts having desired physical and electrical properties.

Figure 8:
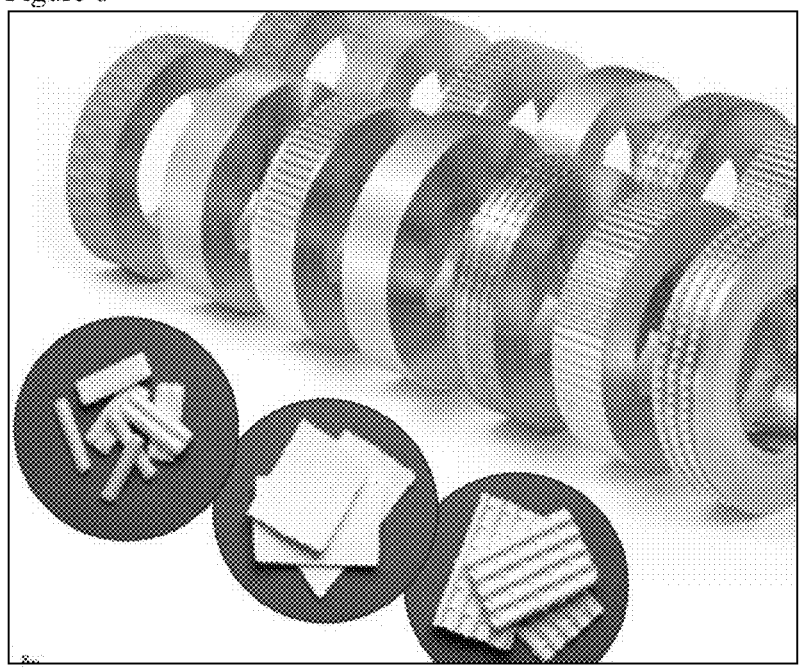
FIG. 8 is a schematic view of shapes produced by exemplary roll compaction.

Green, scored substrates may be produced in a similar sheet or tape manufacturing process with reliance on specialized tooling to form the score lines in an unfired substrate. As a tool produces a substrate shape, score blades in the tooling penetrate a part's surface to a controlled depth. A substrate can then be singulated by a customer at later time. Dimensional and design criteria generally apply for green scoring with some exceptions. FIG. 8 shows typical shapes and sizes achievable in the green stage by roll compaction.

In some embodiments a sacrificial template comprises a first portion comprising first and second surfaces; and a predetermined pattern in the first surface wherein the predetermined pattern forms a three dimensional template; optionally, the predetermined pattern has dimensions greater than 1 micron; optionally, the first portion consists of one or combination of graphite, graphite foil, carbon, carbon foil, few-layer graphene, carbon tissue, or flexible organic sheet; optionally, the first portion comprises a material consisting of one or combination of polyimide, conductive powder, spin-on-glass, polymeric organic, resin, epoxy, inorganic polymer, silicon, silicon from a plasma spray or molten silicon from a liquid source, SiC, TiC, TiN, BN, W, pyrolitic carbon and carbon; optionally, the first portion and the material are of a composition that can be reacted chemically such that substantially all of the sacrificial template can be consumed by one or more reactive processes; optionally, the material has been carbonized and planarized by one or more steps of spinning, heating and polishing; optionally, the pattern in the first surface is created by one or combination of embossing with a textured platen or roller, an imprinted groove, a mask comprising a block co-polymer operable for directed self-assembly, shadow mask, screen printed mask, conventional lithography, laser direct writing, roll compaction and a subtractive removal step, ablation; optionally, the sacrificial template is useable again after removing from the structure.

In some embodiments a sacrificial template comprises a carbonaceous portion comprising first and second surfaces; and a predetermined pattern in the first surface wherein the predetermined pattern forms a three dimensional template with dimensions greater than 1 micron wherein the carbonaceous portion is one or combination of graphite, graphite foil, carbon, carbon foil, carbon tissue, or flexible organic sheet; wherein the carbonaceous portion is of a composition that can be reacted chemically such that substantially all of the sacrificial template can be consumed by one or more chemical reactions.

In some embodiments a method for manufacturing a device comprises the steps; choosing a sacrificial template with a three dimensional pattern in a first surface; depositing a first and second first layer over the first surface; defining or imprinting features in the second layer; and depositing an active layer operable in the device; wherein the active layer is in electrical contact with the first layer through a feature in the second layer.

In some embodiments a method for manufacturing a device comprises the steps; choosing a sacrificial template with a three dimensional pattern in a first surface; depositing a first layer over the first surface consisting of a barrier material; depositing a second layer over the first layer comprising one or more layers wherein at least one layer of the second layer consists of a conductive layer; depositing an active layer operable in the device; wherein the active layer is in electrical contact with the conductive layer in the second layer; optionally, the first layer comprises one or more layers of a composition chosen from a group consisting of boehmite, $Al_2O_3$, carbides, nitrides, silicides, zirconia, tungsten, silicon alumina, other ceramics and mixtures thereof; optionally, further comprising the step, curing the second layer after the imprinting such that the depositing of an active layer may be done above 700° C.; optionally, further comprising the steps; depositing a flexible support layer; and removing the sacrificial template by one or more steps of chemical reaction, sputter etching, thermal ablation, etching a release layer, and flexing a mechanical release layer; optionally, further comprising the step recrystallizing the active layer such that at least 90% of the recrystallized active layer has crystal grains of at least 1 micron in size in a lateral dimension.

In some embodiments layers comprising tungsten/heavily doped Si+++/TCO (transparent conductive oxide)/Ti/Cu are deposited as part of a mask to create a sacrificial template; subsequently the W pattern is left on the template. The first layer functions as a barrier layer preventing contamination in the template from diffusing into the second layer, the active layer. Optionally, zirconia or silicon alumina may form a chemical release layer or a mechanical release layer enabling a reusable template; optionally tungsten may be used as a barrier layer and an electrically conductive layer.

In some embodiments a device constructed on a sacrificial template with a three dimensional pattern with a conductive layer comprises an active layer operable as a photovoltaic device and comprising at least a portion recrystallized such that the recrystallized portion contains grains larger than 10 microns over 90% of the recrystallized portion; and a non-conductive layer separating a conductive layer from the active layer; wherein the non-conductive layer comprises a via in the non-conductive layer such that the active layer is electrically connected to the conductive layer and the sacrificial template is removed after the device is structurally complete.

Other Structures Comprising Silicon

Briefly described, various exemplary embodiments of a silicon-based anode for use in a battery generally comprise silicon surfaces, nodules, columns, whiskers or other features; the features may be formed during a silicon deposition step upon a template or may be formed by a subsequent process step such as chemical etching or electro-chemical etching. In some cases a deposition step is tuned or optimized to achieve a certain degree of porosity in a silicon layer thus creating nodular formations of predetermined size and porosity.

Typically a binder such as, a polyvinyl acid, and in some examples, vinylene carbonate is used. Methods of manufacturing and compositions of various embodiments of silicon-based anodes are intended to, among other possible benefits, provide stability to and enhance the performance of silicon-based anodes during charging and discharging operations. Some embodiments of disclosed silicon-based anodes are adapted to operate in lithium-ion batteries. In silicon-based anodes, typically, a binder binds to the silicon and provides stability and may enhance the performance of an anode by contributing to the formation of a more stable solid-electrolyte interphase, which can minimize the irreversible capacity loss. Conventional binders used in silicon-based anodes are carboxymethylcellulose ("CMC") and poly(vinylidene fluoride) ("PVDF"), which attach to silicon surfaces via relatively weak van-der-Waals forces and do not accommodate large changes in spacing between silicon particles caused by expanding and contracting.

Some technical challenges encountered with using silicon as the basis for an anode are electrochemical alloying, and dealloying, of silicon and lithium causing volume changes; silicon expands upon lithium insertion into a silicon or silicon-lithium matrix; alternatively silicon contracts during lithium extraction from a silicon-lithium alloy matrix. Such volume changes compromise interfaces between silicon and a binder. For example, a portion of a binder may lift off a silicon surface, creating a void in the interface which allows solvent remaining in the anode to creep into a remaining portion of the interface, breaking additional bonding between the binder and the silicon, and destroying the interface. Additionally, if an interface is partially lifted, creating a void, the interface may not be strong enough to be maintained when the silicon swells.

Some embodiments of a silicon-based anode utilize polyvinyl acids containing carboxyl, phosphoric, sulfonic acid groups, or any combination thereof, as a binder. Polyvinyl acids present advantages over conventional binders; various acidic functional groups can be accurately positioned in the vicinity of or further away from each other, thus enabling optimization of a silicon-based anode. Additionally, polyvinyl acids offer higher concentrations of acidic functional groups to interact with strongly electropositive lithium.

In some embodiments, silicon may be coated with a carbon coating to improve the electrical conductivity within an anode, improve properties of the silicon/binder interface, and reduce degradation of electrolytes. Some embodiments also comprise vinylene carbonate to help seal an interface between silicon and binder, so that the interface is not compromised during operation. Vinylene carbonate can be formulated into a vinylene carbonate-containing material to have time-dependent release rates of vinylene carbonate during battery operation, battery storage, or during "formation cycles" performed by a battery manufacturer. The gradual rate of vinylene carbonate release can range, for example, from one day to three hundred days. The vinylene carbonate releasing material can be in the form of particles added into the anode, cathode or electrolyte, or can be a part of a membrane separating the cathode from the anode; vinylene carbonate can be directly added into the electrolyte solution during battery cell fabrication.

In some embodiments a sacrificial or removable template may be used to support a silicon structure operable to function as part of an anode for a battery. Silicon may be deposited upon a three dimensional sacrificial template by well known processes including plasma spray, physical vapor deposition, chemical vapor deposition, optionally plasma assisted, or others known to one knowledgeable in the art. In some embodiments the density of silicon formed on a template is varied during the deposition process from bulk silicon, about 2.33 g/cm$^3$, to less than bulk density in a range from about 98% to about 25% of bulk. In some embodiments the density of silicon formed on a template is modified after the deposition process from bulk silicon in a range from about 98% to about 25% of bulk. The modification process may be one utilizing chemical or electro-chemical etching or other techniques known to one knowledgeable in the art. In this way a three dimensional structure comprising silicon is formed on a three dimensional, sacrificial template wherein the silicon portion has a density ranging from about 2.33 g/cm$^3$ to about 0.58 g/cm$^3$. Subsequent processing steps remove the template, destructively or not, and process the silicon based structure such that it may be operative as an anode in a battery, optionally, a lithium based battery. In some embodiments porosity of the silicon structure functions to alleviate swelling and shrinkage associated with cycling, charging and discharging, of a battery.

In some embodiments a method for manufacturing a device comprises the steps; choosing a sacrificial template with a three dimensional pattern in a first surface; depositing a first and second first layer over the first surface wherein the bulk density of the first layer is different than the bulk density of the second layer; optionally, the first and second layers have a density ranging from about 2.33 g/cm$^3$ to about 0.58 g/cm$^3$; optionally, the device is operable as an anode in a battery after the template with a three dimensional pattern is removed.

Figure 6A:
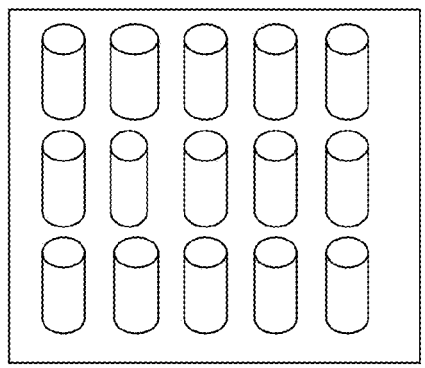
FIG. 6A is a schematic view of an exemplary array of cylinders on a substrate as a template.
Figure 6B:
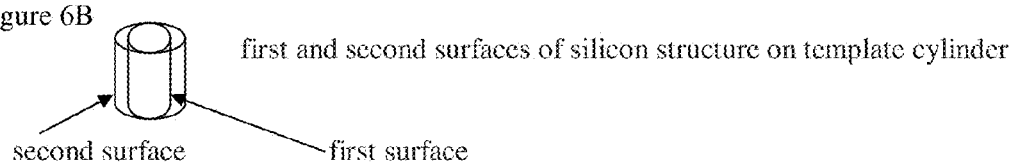
FIG. 6B is a schematic view of an exemplary silicon cylinder deposited upon the array of cylinders.

In some embodiments a structure constructed on a sacrificial template with a three dimensional pattern operable as an anode in a battery comprises a layer of silicon modified to react electrochemically with a primary constituent of the battery wherein the sacrificial template is removed after the silicon layer is modified; optionally modifying the silicon may consist of growing a layer, optionally, silicon dioxide on the silicon surface; optionally, a portion of the layer of silicon has a bulk density between about density ranging from about 2.33 g/cm$^3$ to about 0.58 g/cm$^3$; optionally, the three dimensional pattern is an array of cylinders, as shown schematically in FIG. 6A, wherein the cylinders have a diameter between about 0.1 microns and 300 microns and a center to center spacing between about 5 microns and 500 microns; optionally, the layer of silicon comprises a first and second surface, as shown schematically in FIG. 6B, and wherein the first surface is in contact with the sacrificial template and the second surface is covered with a layer permeable to the primary constituent of the battery before the sacrificial template is removed; optionally, the layer comprises at least one of silicon dioxide, carbon and a polymer.

In some embodiments a structure constructed on a sacrificial template with a three dimensional pattern operable as an anode in a battery comprises silicon particles encased in carbon and/or silicon dioxide forming a porous type structure. This structure follows the work of Hui Wu and co-workers but is distinctive in that the silicon particles are deposited by a high rate process such as plasma spray, physical vapor deposition, chemical vapor deposition, optionally plasma assisted, or others known to one knowledgeable in the art; the starting material is not silicon nanoparticles or SiNP as disclosed by Wu. Key, distinctive features of the present invention are the use of a sacrificial or removable template and the deposition of a layer with predetermined physical parameters, such as size, porosity, composition and structure. In some embodiments high purity, theoretically dense silicon with a photoactive layer is the goal; in some embodiments the deposited layer's physical structure and characteristics are paramount.

In some embodiments a sacrificial or removable template has a configuration of a field of vertical cylinders, ranging in diameter from 0.1 microns to about 300 microns with a cylinder-to-cylinder spacing ranging in distance from about 3 to about 500 microns. A substantially silicon layer is deposited over this template; optionally, the outer surface is subsequently oxidized, or chemically modified, with a layer ranging in thickness from about 1 nm to about 1,000 nm; optionally, a different barrier layer may be deposited or a different chemical treatment of the silicon surface may be performed. A deposited layer, optionally silicon, ranges in thickness between about 50 nm to about 1,000 nm. After removal of the template the array of silicon hollow cylinders may form the basis for an anode in a battery such as a lithium based battery wherein the lithiation of a silicon cylinder occurs on the interior of the silicon cylinder in such a manner as not to be destructive of the cylinder itself and may be repeated or cycled multiple times.

In some embodiments a sacrificial template comprises; first and second surfaces; and a predetermined pattern in the first surface wherein the predetermined pattern forms a three dimensional template suitable for the formation of a device comprising an active layer comprising a first portion recrystallized above 800° C.; optionally, the predetermined pattern has dimensions greater than 1 micron; optionally, at least a portion of the template is composed of one or combination of materials chosen from a group consisting of graphite, graphite foil, carbon, pyrolitic carbon, carbon foil, carbon tissue, ceramic, boehmite, Al$_2$O$_3$, carbides, nitrides, silicides, zirconia, tungsten, silicon alumina, flexible organic sheet, polyimide, conductive powder, spin-on-glass, polymeric organic, resin, epoxy, inorganic polymer, silicon, silicon from a plasma spray or molten silicon from a liquid source, SiC, TiC, TiN, BN, and W; optionally, the composition is one that can be reacted chemically such that substantially all of the sacrificial template can be consumed by one or more reactive processes; optionally, the material has been carbonized and planarized by one or more steps of spinning, heating and polishing; optionally, the pattern in the first surface is created by one or combination of embossing with a textured platen or roller, an imprinted groove, casting, a mask comprising a block co-polymer operable for directed self-assembly, shadow mask, screen printed mask, masking with a metallic layer, conventional lithography, laser direct writing, roll compaction, a subtractive removal step and ablation; optionally, the sacrificial template is removed non-destructively from a deposited structure such that it is reusable.

In some embodiments a sacrificial template comprises; a carbonaceous portion comprising first and second surfaces; and a predetermined pattern in the first surface wherein the predetermined pattern forms a three dimensional template with dimensions greater than 1 micron wherein the carbonaceous portion is one or combination of graphite, graphite foil, carbon, carbon foil, carbon tissue, or flexible organic sheet; wherein the carbonaceous portion is of a composition that can be reacted chemically such that substantially all of the sacrificial template can be consumed by one or more chemical reactions; optionally, the second surface of the carbonaceous portion is attached to a second portion and the predetermined pattern is formed substantially in the carbonaceous portion.

In some embodiments a method of utilising a sacrificial template for manufacturing a device comprises the steps; choosing a sacrificial template comprising first and second surfaces; depositing a first layer over the first surface; defining a pattern in the first layer and a feature into the first surface; depositing a first portion of an active layer operable in the device over the patterned first layer and feature; and recrystallizing the first portion of the active layer such that at least 90% of the recrystallized active layer has crystal grains of at least 1 micron in size in a lateral dimension; optionally, the step recrystallizing the first portion of the active layer is done above 800° C.; optionally, the first layer comprises one or more layers of a composition chosen from a group consisting of boehmite, $Al_2O_3$, carbides, nitrides, silicides, zirconia SiC, TiC, TiN, BN, TaN, W, silicon alumina, mechanical release layer, refractory metal, TCO and other ceramics and mixtures thereof; optionally, an additional step of depositing a second layer over the first layer comprising one or more layers wherein at least one layer of the second layer consists of a conductive layer or a barrier layer; optionally, further comprising the step; curing the second layer such that the depositing of the first portion of the active layer an active layer may be done above 700° C.; optionally, further comprising the steps; depositing on the recrystallized first portion of the active layer a second portion of the active layer comprising at least one of a not-intentionally-doped layer and a layer of conductivity type opposite the conductivity type of the first portion of the active layer; optionally, further comprising the steps; depositing a support layer; and removing at least a portion of the sacrificial template; optionally, further comprising the steps; depositing an anti-reflection coating over the recrystallized first portion of the active layer after the removal of at least a portion of the sacrificial template; optionally, the sacrificial template is removed by one or more steps of chemical reaction, sputter etching, thermal ablation, etching a release layer, and flexing a mechanical release layer; in some embodiments a device is manufactured by the disclosed method.

In some embodiments a method of utilizing a sacrificial template for manufacturing a device comprises the steps; choosing a sacrificial template comprising first and second surfaces; depositing a first and second first layer over the first surface wherein the bulk density of the first layer is different than the bulk density of the second layer; optionally, the composition of the first and second layer is at least 95% silicon by weight; optionally, the device is operable as an anode in a battery after the template with a three dimensional pattern is removed; optionally, a device is manufactured by the disclosed method.

In some embodiments a sacrificial template with a three dimensional pattern for constructing a structure operable as an anode in a battery comprises a layer of silicon comprising a portion modified to react electrochemically with a primary constituent of the battery wherein the sacrificial template is removed after the portion of the silicon layer is modified; optionally, the three dimensional pattern is an array of cylinders wherein the cylinders have a diameter between about 0.1 microns and 300 microns and a center to center spacing between about 1 microns and 500 microns; optionally, the portion of the layer of silicon modified to react electrochemically with a primary constituent of the battery has a bulk density between about 2.33 $g/cm^3$ and about 0.58 $g/cm^3$; optionally, the layer of silicon comprises a first and second surface and wherein the first surface is in contact with the sacrificial template and the second surface is covered with a layer permeable to the primary constituent of the battery before the sacrificial template is removed; optionally, the permeable layer comprises silicon dioxide.

In the previous description, numerous specific details are set forth to provide a thorough understanding of the present invention. However, it will be apparent to one of ordinary skill in the art that the invention may be practiced without these particular details. In other instances, methods, procedures, and components that are well known to those of ordinary skill in the art are not described in detail to avoid obscuring aspects of the present invention.

It will be understood that when a layer is referred to as being "on top of" or "over" another layer, it can be directly on the other layer or intervening layers may also be present. In contrast, when a layer is referred to as "contacting" another layer, there are no intervening layers present. Similarly, it will be understood that when a layer is referred to as being "below" another layer, it can be directly under the other layer or intervening layers may also be present.

It will also be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer, without departing from the scope of the present invention.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilise the invention and various embodiments with various modifications as are suited to the particular use contemplated.

We claim:

1. A method of utilizing a sacrificial template with three dimensional features for manufacturing a device comprising the steps;
   providing a sacrificial template with three dimensional features comprising first and second surfaces;
   depositing a first layer over the first surface;
   forming a pattern in the first layer and a feature into the first surface;
   depositing a first portion of an active layer operable in the device over the patterned first layer and feature;
   recrystallizing the first portion of the active layer such that at least 90% of the recrystallized active layer has crystal grains of at least 1 micron in size in a lateral dimension; and
   removing the sacrificial template with the three dimensional features by one or more steps of chemical reaction, sputter etching, thermal ablation, etching a release layer, and flexing a mechanical release layer acting on the second surface.

2. The method of claim 1 wherein the step recrystallizing the first portion of the active layer is done above the melting point of the active layer.

3. The method of claim 1 wherein the first layer comprises one or more layers of a composition chosen from a group consisting of boehmite, $Al_2O_3$, carbides, nitrides, silicides, zirconia SiC, TiC, TiN, BN, TaN, W, silicon alumina, mechanical release layer, refractory metal, TCO and other ceramics and mixtures thereof.

4. The method of claim 3 further comprising the step of depositing a second layer over the first layer comprising one or more layers wherein at least one layer of the second layer consists of a conductive layer or a barrier layer.

5. The method of claim 3 further comprising the step; curing the first layer such that the depositing of the first portion of the active layer is done above 700° C.

6. The method of claim 2 further comprising the steps;
   depositing on the recrystallized first portion of the active layer a second portion of the active layer comprising at least one of a not-intentionally-doped layer and a layer of conductivity type opposite the conductivity type of the first portion of the active layer.

7. The method of claim 2 further comprising the steps;
   depositing a support layer; and
   removing at least a portion of the sacrificial template.

8. The method of claim 7 further comprising the steps;
   depositing an anti-reflection coating over the recrystallized first portion of the active layer after the removal of at least a portion of the sacrificial template.

9. A method of utilizing a sacrificial template with a three dimensional pattern for manufacturing a device comprising the steps;
   providing a sacrificial template comprising first and second surfaces;
   depositing a first layer of first bulk density and first porosity and first composition over the first surface; and
   depositing a second layer of second bulk density and second porosity and second composition over the first layer wherein the first bulk density and first porosity of the first layer is different than the second bulk density and second porosity of the second layer;
   removing the sacrificial template with the three dimensional pattern by one or more steps of chemical reaction, sputter etching, thermal ablation, etching a release layer, and flexing a mechanical release layer acting on the second surface.

10. The method of claim 9 wherein the first composition of the first layer and the second composition of the second layer are at least 95% silicon by weight.

11. The method of claim 9 wherein the device is operable as an anode in a battery.

* * * * *